United States Patent [19]

Pascente

[11] 3,917,962

[45] Nov. 4, 1975

[54] SYNCHRONOUS SWITCHING CIRCUIT

[75] Inventor: Joseph E. Pascente, Norridge, Ill.

[73] Assignee: Grigsby-Barton, Inc., Rolling Meadows, Ill.

[22] Filed: Mar. 4, 1974

[21] Appl. No.: 447,675

Related U.S. Application Data

[63] Continuation of Ser. No. 350,118, April 11, 1973, abandoned, which is a continuation-in-part of Ser. No. 231,652, March 3, 1972, Pat. No. 3,758,793.

[52] U.S. Cl. ...... 307/252 UA; 307/252 B; 307/311; 323/18; 323/24

[51] Int. Cl. ........ H03k 17/72

[58] Field of Search ......... 307/252 B, 252 UA, 311; 323/22 T, 22 SC, 18, 24

[56] References Cited

UNITED STATES PATENTS

| | | | |
|---|---|---|---|
| 3,328,606 | 6/1967 | Pinckaers | 307/252 B |
| 3,648,075 | 3/1972 | Mankovitz | 307/252 B |
| 3,723,769 | 3/1973 | Collins | 307/252 B |

*Primary Examiner*—John Zazworsky
*Attorney, Agent, or Firm*—Fitch, Even, Tabin & Luedeka

[57] ABSTRACT

A switching circuit for controlling the application of an a.c. source to a load employs a detector for triggering a control thyristor at a zero-voltage crossing of the a.c. source and means for supplying a latch current to the gate of the control thyristor during succeeding cycles of the a.c. source. The control thyristor is employed to latch a switching thyristor which, in turn, applies the power from the a.c. source to the load. The detector includes a transistor with a switching means connected between the transistor control terminal and one of the load terminals and biased so that the transistor is normally conductive when the switching means is open circuited to thereby shunt current away from the gate terminal of the control thyristor. When the switching means is conductive, the transistor is biased to be rendered non-conductive when the a.c. source voltage passes through zero and thereby applies current to the gate terminal of the control thyristor.

7 Claims, 1 Drawing Figure

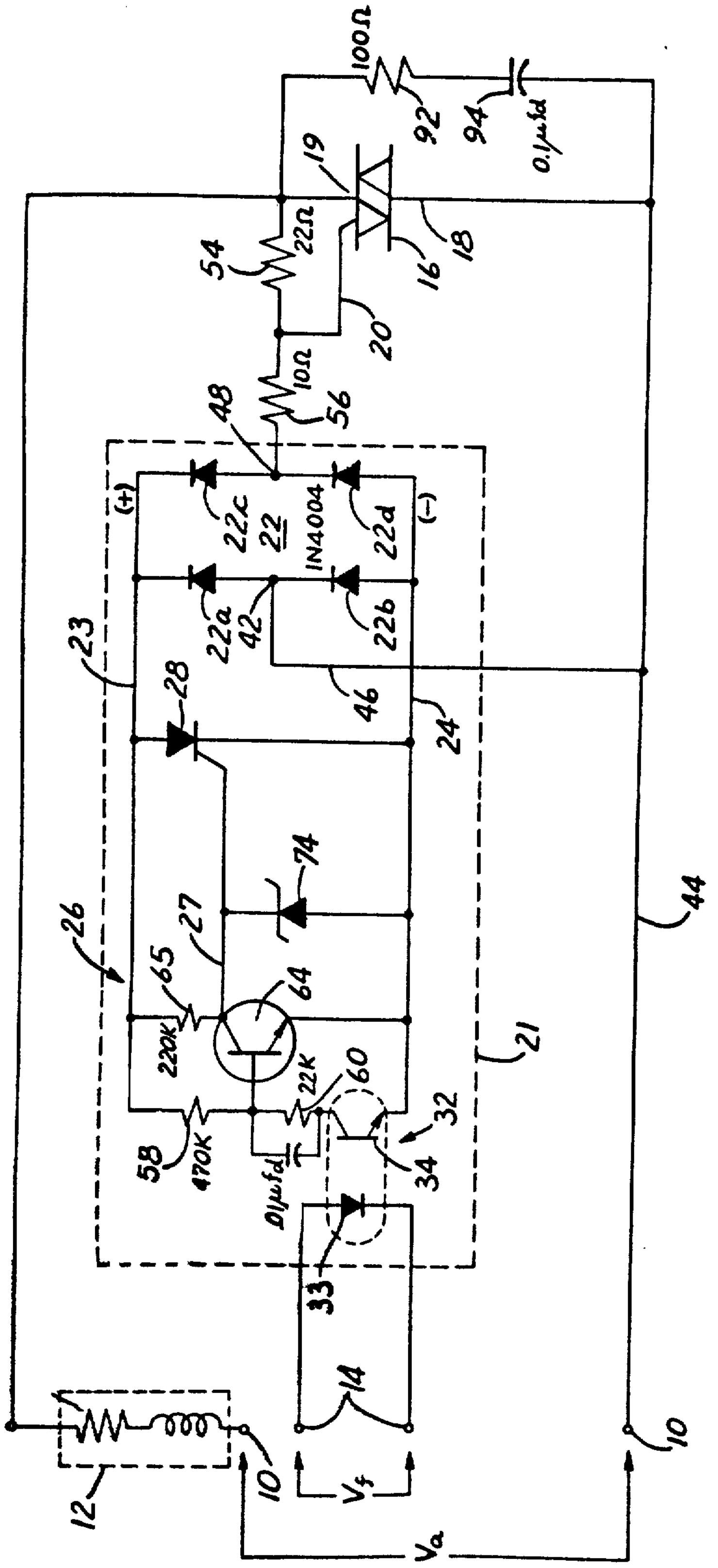
100Ω
0.1μfd
22Ω
10Ω
(+)
(-)
IN4004
220K
470K
22K
.01μfd
$V_f$
$V_a$

SYNCHRONOUS SWITCHING CIRCUIT

This application is a continuation of my application Ser. No. 350,118, filed Apr. 11, 1973, now abandoned, which is a continuation-in-part of my application Ser. No. 231,652, filed Mar. 3, 1972, and now U.S. Pat. No. 3,758,793.

The present invention relates to zero-voltage a.c. switching circuits and, more particularly, to such circuits employing a triac or thyristor element or elements arranged for bi-directional operation.

Many circuits described as zero-voltage or synchronous switching circuits which employ thyristor elements to apply power to a load at a zero voltage crossing point, and remove power from the load at a zero current point, are now well known. However, many of such circuits heretofore proposed have presented special problems when used with certain types of loads. More particularly, the circuits have generally presented problems in switching highly reactive loads, as well as in switching resistive or reactive loads which draw either extremely high current or extremely low current relative to the normal ratings of economically practicable and available thyristors.

Various problems associated with the switching of reactive loads are discussed at some length in a number of available publications, such as the General Electric SCR Manuals, Fourth Ed., 1967 and Fifth Ed., 1972. The problems associated with the switching of extremely high current loads arise because thyristors, such as triacs, which have high load terminal current ratings also generally require high gate currents for firing, and such gate currents have typically been obtained by providing additional amplification stages in the zero-voltage switching circuit, which adds to the cost and complexity of the circuit. Conversely, in the switching of low load currents, a problem so often occurs in that the thyristor tends to become non-conductive, i.e., to turn off, when the load current is almost equal to the latching current rating of the thyristor itself.

Further, in many applications, for example, the triac of an a.c. zero-voltage switching circuit is required to turn on a load that initially draws relatively low current, but may later increase to a high current. Typically, the higher the average load current rating of a thyristor, the higher will be the latch current, and such a load would normally present serious problems in achieving zero-volt switching with such previously existing circuits.

An improved zero-voltage switching circuit which may be utilized to switch either high or low current loads, or loads which draw varying currents from one extreme to the other, is disclosed in my U.S. Pat. No. 3,668,422, as well as in my above-identified application, Ser. No. 231,652. Those circuits employ a zero-voltage crossing detector for selectively triggering a control thyristor at a zero voltage crossing of the source and means for supplying a latch current to the gate of the control thyristor during succeeding cycles of the a.c. source. The control thyristor then latches a switching thyristor which, in turn, applies the power from the a.c. source to the load.

Accordingly, it is a primary object of the present invention to provide an improved zero-voltage switching circuit of the above type which, in addition to being capable of switching either high or low current loads, or loads which draw varying current from one extreme to the other, is of relatively lower cost and complexity.

Another object of the present invention is to provide such an improved zero-voltage switching circuit which incorporates a zero-voltage detector circuit including provision for disabling and enabling the detector responsive to an external control signal, wherein the complete detecting circuitry, and associated components, are capable of being fabricated using microcircuit techniques to implement the circuit, for example, in the form of a hybrid circuit structure capable of being housed within a dual in-line package.

Other objects and advantages of the present invention will become apparent upon reading the following detailed description, while referring to the attached drawing which is a schematic diagram of a zero-voltage a.c. switching circuit embodying the present invention.

Broadly stated, and referring to the drawing there is shown a switching circuit embodying the present invention for controlling the application of an a.c. voltage source $V_a$ from line terminals 10 to a load 12 which is illustrated to include resistance and inductive reactance, in response to a control command signal $V_f$ applied to control terminals 14 for actuation and deactuation of the circuit. Switching thyristor means, illustrated as a triac 16, having a pair of load terminals, shown as anode 18 and cathode 19 (by analogy to SCR convention), and a control gate terminal 20, has its load terminals 18 and 19 connected in series with the a.c. source (line terminals 10) and the load 12. The triac 16 is switchable from a normally non-conductive or "off" state to a conductive or "on" state by an appropriate firing signal applied between the thyristor gate terminal 20 and one of its load terminals, with proper potential applied across both load terminals. To remain in the conductive state without further firing or gate input, such thyristors must generally have a current flowing between their load terminals which is at least as great, and preferably greater, than the rated latch current of the thyristor. Otherwise, the thyristor will be "starved off" and will return to its normally non-conductive state. To prevent this from occurring, circuit means hereinafter described, provide positive latching of the thyristor by effectively coupling its gate terminal to the line voltage applied to the appropriate thyristor load terminal, such as its anode 18.

To operatr the switching triac 16, circuit means, indicated generally as 21, generally comprises rectifier means 22 for providing a rectified d.c. voltage across circuit leads 23 and 24 from the a.c. source voltage $V_a$. Additionally, the circuit means 21 includes means illustrated generally as a synchronous detector 26, for providing an output signal on lead 27 indicative of a zero-voltage crossing of the a.c. source voltage $V_a$ and a control thyristor, illustrated as a silicon control rectifier (SCR) 28 having its anode and cathode load terminals respectively connected across circuit leads 23 and 24, and which is selectively responsive to the application of the zero-voltage detection signal supplied to its gate terminal for triggering the SCR 28 to its conductive state. The operating circuit 21 is coupled to the triac 16 through the rectifier means 22 which also functions as a means for steering the current in the appropriate manner to achieve the desired switching operation, as will be hereinafter described. Additionally, the rectifier means 22 supplies a continuous gate or latching current to the SCR 28 during all succeeding cycles of the source voltage $V_a$, once the SCR 28 is triggered by the zero-voltage detection signal from the detector 26 so that positive latching of the SCR 28 in its conductive state is assured.

Once the SCR 28 is in its conductive state, the voltage across the SCR anode and cathode drops to a value of approximately zero, but is actually determined by the inherent forward conducting characteristics of the SCR, typically about 1 volt. Therefore, a small voltage (also about 1 volt or fraction thereof) will appear across the gate resistor and a gate current will flow through the gate-cathode terminals of the SCR. Thus, because of the voltage drop, albeit small, which occurs across the SCR, the gate current is supplied from the rectifier means during succeeding cycles of the a.c. source, and the SCR is considered to be "latched" in its conductive state.

Control switching means 32, illustrated as a normally "open circuit" opto-electronic relay or optical coupler, is responsive to the command control signal $V_f$ through a current limiting resistor (not shown) for selectively enabling or disabling the zero-voltage detector 26 and thereby enabling or disabling the application of the zero-voltage detection signal as well as the continuous gate current to the gate of the SCR 28, resulting in actuation or de-activication of the circuit.

The use of the opto-electronic relay in the control switching means 32 within the base-emitter circuit of the transistor 64 has many advantages in addition to providing complete d.c. isolation between the controlling circuit and the operating circuit 21 for the reason that it effectively controls the base current to transistor 64 which is appreciably smaller than the collector current. By varying the phototransistor between cutoff and a non critical, unsaturated condition, the transistor 64 can be readily controlled and therefore enables the use of a relatively inexpensive optical coupler or optoelectronic relay. In normal circuit applications, it is only necessary that the transfer ratio of the optical relay (defined as the ratio of output current/input current, i.e., the current through the collector emitter path of photo transistor 34 with respect to the current through the light emitting diode) be only 10 percent. In this connection, it has been found that effective circuit operation results with transfer ratios of only 1 percent because of the relatively small base current values that are typically present. By having the capability of satisfactorily employing an optical coupler with relatively low efficiency, the cost of the circuit is appreciably reduced. If, for example, the optical coupler was placed in the collector circuit, an optical coupler having at least a 50 percent or greater transfer ratio would normally be required and such devices are presently much more expensive. Alternatively, a relatively inexpensive optical coupler having a transfer ratio on the order of 10 percent, could be used in the collector circuit, but, in such case, a separate amplification circuit, such as a Darlington amplifier or other circuit components would be required and the cost involved in incorporating such additional devices would also be undesirable from an economic standpoint. Moreover, if the operating circuit 21 is intended to be fabricated into what is commonly referred to as a dual in-line package (DIP), such component additions would occupy additional area in the configuration and the available area within the package is at a premium even without such additions.

Consequently, in the illustrated embodiment, the command signal voltage $V_f$ applied to the control terminals 14, regardless of when applied, causes the triac 16 to turn on at the next zero voltage crossing of the a.c. source, and thus results in the power being applied to the load 12 at that time. Removal of the command signal $V_f$, i.e., $V_f = 0$, at any time causes the triac 16 to turn off when the next succeeding cycle of current goes to zero (or becomes less than the minimum holding current rating of the triac).

More particularly, the control switching means 32 preferably comprises an opto-electronic relay that includes a light-emitting diode 33 connected across the control terminals 14 and a light-sensitive or phototransistor 34 optically coupled to the light-emitting diode and adapted to go into conduction or to a predetermined value of conductance when the command signal voltage $V_f$ is applied to activate the light-emitting diode 33. Thus, the phototransistor 34 is normally "open circuited" at a high predetermined value of resistance or impedance when the command signal voltage is zero, and in such condition, the zero voltage detector 26 is disabled, as will be fully described hereinafter.

The current for the operating circuit 21 is derived from the rectifier means 22 which comprises a full-wave rectifier bridge formed by diodes 22*a* through 22*d* and provides full-wave rectified d.c. pulses across leads 23 and 24. These leads are respectively connected to the positive and negative output terminals of the bridge, as shown. The a.c. line voltage $V_a$ is supplied to one input terminal 42 of the bridge through a direct conductive connection via a.c. reference leads 44 and 46 and to the opposite input terminal 48 of the bridge via a.c. lead 50, load 12, and load lead 52, as well as through coupling resistor 54 (between the gate and cathode of the triac 16) and the current limiting resistor 56. The resulting full-wave rectified voltage across leads 23 and 24 is applied across the anode and cathode of the SCR 28 and across the synchronous detector circuit 26.

The synchronous detector circuit 26 comprises a voltage divider formed by base bias resistors 58 and 60, with resistor 58 being connected between lead 23 and the base of a transistor 64 as well as to resistor 60 which is connected to the collector of the phototransistor 34, the emitter of which is connected to lead 24. A capacitor 62 may be connected in parallel with resistor 60 to provide an appropriate phase shift to insure proper operation of the circuit in the event highly inductive loads are being controlled by the triac 16. Thus, when phototransistor 34 is conducting, full-wave rectified voltage is applied to the resistors, 58 and 60, and a positive divided voltage is applied to the base of transistor 64.

In this connection, it is noted that when phototransistor 34 is conducting, it is not necessarily in saturation but is reduced to a lesser non critical resistance or impedance, (of about 10 K ohm, for example), compared to its non-conductive condition of substantially higher resistance which is comparable to an open circuit. Thus, when phototransistor 34 is conducting, the voltage divider is formed by resistor 58 in combination with the resistor 60 in series with the collector-emitter resistance or impedance of phototransistor 34. The positive divided voltage applied to the base of transistor 64 is sufficiently reduced when compared to the undivided voltage applied to the bases of transistor 64 when the phototransistor 34 is non-conductive (or effectively open-circuited) to enable transistor 64 to be cutoff when the a.c. source voltage passes through zero as will be hereinafter described. The emitter of the transistor 64 is connected directly to the lead 24 which forms the common reference lead of the operating circuit 21. The collector of transistor 64 is connected to the positive lead 23 through a collector resistor 65 (which is preferably as high a value as possible to minimize heat) so that the full-wave rectified generated voltage is also applied across the collector-emitter circuit of the transistor. A Zener diode 74 may optionally be connected in shunt with the collector and emitter of transistor 64 as a protective device for preventing excessive voltage from being applied thereacross.

In operation, and assuming for the moment that the command control signal $V_f$ is applied at terminals 14 so as to result in photo-sensitive transistor 34 being in conduction, the divided full-wave rectified voltage appearing across the base-emitter circuit of the transistor 64 normally forward biases the base-emitter junction of the transistor for conduction, except near the zero voltage point of the full-wave rectified voltage, where the transistor 64, due to its inherent characteristics, will be non-conductive. This cut-off voltage may typically be about 0.7 volts, so the transistor 64 will be non-conductive symmetrically with respect to time about each zero-voltage crossing. Thus, the collector-emitter circuit of the transistor 64 is capable (assuming other circuit conditions are satisfied) of conducting during the major portion of each half cycle of the source voltage, and is incapable of conducting during the short time interval of each half cycle point of the zero-voltage crossing when the base-emitter voltage falls below the cut-off voltage of the transistor.

The zero-voltage detector output signal is taken across the collector and emitter of the transistor 64. This signal is essentially zero or some small constant voltage when the transistor 64 is conducting, but increases abruptly to a significant positive voltage when the transistor 64 cuts off. Thus, at the initial zero voltage crossing of the a.c. source when the transistor 64 becomes non-conductive, the voltage on detector output signal 27 will go from about zero or some positive voltage to 6, a higher value which will be applied to the gate of SCR 28 in the form of an output pulse. Simultaneously, the rectified voltage across the anode and cathode of the SCR which is in phase with the line voltage, will be increasing to provide an anode voltage of proper polarity and magnitude so that the SCR 28 will become conductive in response to the positive output pulse on lead 27. Once the SCR 28 becomes conductive, however, it shorts out the voltage across the operating circuit leads 23 and 24 which disables the detector circuit 26 and effectively results in the collector resistor 65, connected between the gate and anode of SCR 28, latching the SCR into conductive condition. This provides a positive latch for all succeeding cycles of the source voltage $V_a$, until the command voltage $V_f$ is returned to zero.

Assuming that $V_f$ continues to be applied, when the SCR 28 shorts out leads 23 and 24, the voltage across the voltage divider of synchronous detection circuit is reduced to to a value that is actually determined by the inherent forward conductive characteristics of the SCR and approaches zero (actually about 1 volt) thereby removing the base drive from the transistor 64. The zero detector output pulse which initiated the firing of SCR 28 degrades as the transistor 64 is cut off, and the current supplied from the rectifier bridge 22 through collector resistor 65 and the SCR (due to the inherent junction capacitance and the residual voltage drop which occurs) provides positive latching action of the SCR 28, transistor 64 being then non-conductive so that the gate and anode of SCR 28 are merely resistively coupled together by the collector resistor. This action may occur on any half cycle of the a.c. source and is independent of whether the a.c. source half cycle is in the first or second half thereof.

With the control SCR 28 conducting, the rectifier bridge 22 also functions as a current steering means and provides a direct conductive connection from the current limiting resistor 56 to the a.c. line reference lead 44, in effect tying the gate 20 of the triac 16 to its anode, assuring that the triac will synchronously switch with the a.c. source voltage. It may be noted that one of the most simple and positive action circuits for utilizing triacs (as well as SCR's) as static switches comprises a resistive coupling between the triac (or SCR) gate terminal and its anode.

More specifically, when the SCR 28 is in its conductive state, the triac gate current path is defined by lead 50 from one of the line terminals 10, through the load 12, lead 52, resistors 54 and 56, rectifier bridge 22, SCR 28 and back to rectifier bridge 22, and then through lead 46 to the other line terminal 10 via lead 44. The bridge 22 steers the current appropriately so that when the lead 52 is positive and lead 44 negative, the current path is through the diode 22c, SCR 28 and diode 22b. When lead 52 is negative and lead 44 positive, the current path is formed by diode 22a, SCR 28 and diode 22b. Thus, it can be seen that the resistor 56 has a direct conductive path to the anode 18 of triac 16 so long as SCR 28 remains conductive to provide a resistive coupling between the gate and anode terminals.

During the normal conduction and synchronous switching of the triac 16 substantially the full line voltage is applied to the load 12 through the triac. During the half cycles of the conduction of the triac, a voltage drop of approximately about 1 volt appears across the triac load terminals. For the inductive load illustrated in the drawing, the power will be applied across the load with the current lagging the voltage in the usual manner as will be determined by the particular characteristics of the load.

In accordance with an aspect of the present invention, the transistor 64 is normally biased by the voltages appearing across leads 23 and 24 together with the values of the resistors 58 and 60, such that when the transistor 34 located in the base-emitter circuit of the transistor 64 is not conductive, i.e., the switching means is open circuited, or approximately so, the voltage applied to the base of the transistor 64 is sufficient to maintain the transistor in conduction and in so doing, continually shunts current away from the gate of the SCR 28, since there is no longer a voltage divider effect defined in part by resistors 58 and 60, (as previously described) as resistor 60 is essentially located in an open circuit. Thus, when phototransistor 34 is non-conductive, voltage is applied to the base to maintain transistor 64 in conduction which effectively disables the detector circuitry 26 and the collector-emitter path of transistor 64 will shunt current away from the gate of SCR 28 even when the source voltage passes through zero. Thus, the control switching means 32 effectively enables or disables the detector 26 to preclude application of the output pulses to the gate of the SCR 28 when the control command voltage $V_f$ is not applied. It should be noted, however, that since SCR's are generally sensitive to noise and other transients, they are susceptible to being falsely triggered. Such "false triggering" of the SCR 28 can be minimized by reducing the forward voltage drop across the collector-emitter of transistor 64 while in conduction, thus more effectively shorting the gate of SCR 28 to its cathode. In this connection, it is preferred that transistor 64 be a transistor having a forward voltage drop of about 50–70 millivolts or less. By utilizing a transistor 64 having a forward voltage drop of about 70 mv. across the collector-emitter circuit during conduction that false triggering was substantially eliminated. Moreover, the dv/dt turn on characteristic is improved with the lower gate to cathode voltage that is achieved with the low forward voltage drop transistor 64. It has also been found that the characteristics of the SCR 28 and transistor 64 provide temperature compensation for each other in that while the leakage gate current increases with temperature, the collector-emitter voltage of transistor 64 decreases and thereby results in effective compensation.

Assuming, however, that the command voltage $V_f$ is applied and SCR 28 triggered into conduction, when the signal command voltage $V_f$ is returned to zero, thereby effectively open circuiting the base-emitter circuit of the transistor 64, causing transistor 64 to become conductive and thereby shunt the gate of SCR 28 to its cathode so that SCR 28 will become non-conductive when the current magnitude drops below its "holding current" rating, the SCR will generally remain conductive for approximately the remaining portion of that half cycle after which time it becomes non-conductive and the full-wave rectifier voltage produced by the rectifier bridge 22 will again appear across the operating circuit leads 23 and 24. The full-wave rectified voltage will thus be applied across the base and collector circuits of the transistor 64, causing it to remain in its conductive state due to the aforementioned biasing condition. The rectified voltage will appear across the collector resistor 65 and SCR 28 will remain non-conductive with its gate shunted to its cathode. With the gate-anode circuit of the triac 16 now being open by the non-conductive state of the SCR 28, the triac will become non-conductive again at approximately the next zero current point, which will coincide with the zero voltage point for resistive loads, or may differ in phase for reactive loads. The lagging or leading load currents that may be produced by reactive loads do not prevent the circuit of the present invention from operating in synchronism with the source voltage.

A very small residual current will generally continue to flow through the load even when the triac 16 is off, and this current is drawn through the bridge 22 by the synchronous detector 26 in its normal quiescent condition. However, this current is negligible in most applications and is of no concern. Removal of the load 12, however, will prevent any current flow into the circuit.

A series commutation circuit formed by resistor 92 and capacitor 94 is connected in shunt with the triac 16 to minimize the dv/dt across the triac load terminals, and is in accordance with conventional practice for this purpose.

The component parameters and values specified in the circuit of the drawing provides satisfactory operation for a line voltage of approximately 220 volts. Satisfactory operation at other voltage, such as 20 volts, 420 volts, or at more than one voltage, may be achieved by suitably varying the component values in accordance with well known circuit design techniques.

Although the presently illustrated circuit employs a triac to switch the line voltage to the load, it is understood that a pair of inverse, parallel connected SCR's may be substituted in the manner illustrated in FIG. 3 of the aforementioned U.S. Pat. No. 3,668,422. Additionally, it should also be understood that while the opto-electronic relay has been shown which includes a light emitting diode and a photo-transistor switch, other components such as a photo diode may be used in place of the phototransistor and a conventional lamp may be used in place of a light emitting diode, although such substitutions may result in a sacrifice in terms of circuit fabrication using microcircuit techniques.

Thus, it should be realized from the foregoing that the synchronous switching circuit embodying the present invention has many desirable attributes in terms of its operating function, economy and design simplicity.

The present invention provides an improved zero-voltage switching circuit which incorporates a zero-voltage detector circuit which, together with associated components are capable of being fabricated using microcircuit techniques such as a hybrid circuit structure housed in a dual in-line package, for example. The incorporation of an opto-electronic relay for uniquely controlling the detector circuit in the manner described herein results in effective enabling and disabling of the detector circuit responsive to a command control signal and, because of the improved design of the switching circuit, permits the use of a low transfer ratio opto-electronic relay which is presently less expensive.

It is of course understood that although a preferred embodiment of the present invention has been illustrated and described, various modifications thereof will be apparent to those skilled in the art, and accordingly, the scope of the present invention should be defined only by the appended claims and equivalents thereof.

Various features of the invention are set forth in the following claims.

What is claimed is:

1. In a circuit for selectively triggering a control thyristor having anode, cathode and gate terminals, at the zero crossing of the voltage of an a.c. source, comprising a full-wave rectifier circuit having input terminals for operable connection thereof to the a.c. source, a zero-voltage crossing detector circuit having load terminals for connection across the anode and cathode of the control thyristor and across the output of said rectifier circuit and including a transistor having a control terminal and a pair of load terminals for controlling the application of current from one of said load terminals to the gate terminal of the control thyristor, said transistor conducting current through said load terminals to thereby shunt current away from said gate terminal when the transistor is in its conductive state, and permitting the flow of current at said gate terminal of the control thyristor for triggering the same when said transistor is in its non-conductive state, and switching means connected between the control terminal and the other of said load terminals of said transistor for continuously maintaining said transistor in conduction when said switching means is non-conductive, the improvement wherein said zero-voltage crossing detector circuit includes a first resistor connected between the anode of the control thyristor and said one load terminal of said transistor, a second resistor connected between the anode of the control thyristor and the control terminal of said transistor, a third resistor series connected with said switching means between said control terminal and said other load terminal of said transistor, said second and third resistors defining a voltage divider for applying a voltage to the control terminal of said transistor such that it is biased to its non-conductive state when said a.c. source voltage passes through zero and when said switching means is conductive, said transistor thereby providing an output pulse to the gate terminal of the control thyristor corresponding to the zero-voltage crossing of the a.c. source and the control thyristor being latched in a conductive state by current flow through said first resistor coupled between the gate and anode of the thyristor so long as said transistor remains non-conductive, said transistor being the sole three terminal transistor device in said zero-voltage crossing detector circuit.

2. The circuit of claim 1 wherein said control thyristor comprises a silicon controlled rectifier and said switching means comprises a normally non-conductive opto-electronic relay that becomes conductive in response to the application of a command signal at the input thereof.

3. The circuit of claim 1 wherein said transistor has a forward voltage drop across its load terminal circuit of an order no greater than approximately 70 millivolts.

4. The circuit of claim 1 further comprising a Zener diode connected across the load terminals of said transistor to limit the magnitude of the voltage developd thereacross.

5. A circuit as defined in claim 2 wherein said optoelectronic relay comprises a light emitting diode energizable responsive to receiving said command signal and a phototransistor optically coupled to said light emitting diode and becoming conductive when said command signal energizes said light emitting diode.

6. A circuit as defined in claim 5 wherein said phototransistor has its collector emitter path connected between said third resistor and said other load terminal of said transistor.

7. A circuit as defined in claim 1 wherein a phase shifting capacitor is connected in parallel across said third resistor.

* * * * *